United States Patent
Lien et al.

(10) Patent No.: US 10,514,980 B2
(45) Date of Patent: Dec. 24, 2019

(54) ENCODING METHOD AND MEMORY STORAGE APPARATUS USING THE SAME

(71) Applicant: Winbond Electronics Corp., Taichung (TW)

(72) Inventors: Chuen-Der Lien, San Jose, CA (US); Ming-Huei Shieh, San Jose, CA (US); Seow Fong Lim, San Jose, CA (US); Ngatik Cheung, San Jose, CA (US); Chi-Shun Lin, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 61 days.

(21) Appl. No.: 15/933,367

(22) Filed: Mar. 22, 2018

(65) Prior Publication Data
US 2019/0294496 A1 Sep. 26, 2019

(51) Int. Cl.
*G06F 11/00* (2006.01)
*G06F 11/10* (2006.01)
*G11C 29/42* (2006.01)

(52) U.S. Cl.
CPC ...... *G06F 11/1044* (2013.01); *G06F 11/1048* (2013.01); *G06F 11/1068* (2013.01); *G11C 29/42* (2013.01)

(58) Field of Classification Search
CPC .............. G06F 11/1044; G06F 11/1048; G06F 11/1068; G11C 29/42
See application file for complete search history.

(56) References Cited

U.S. PATENT DOCUMENTS

| | | | | |
|---|---|---|---|---|
| 7,171,605 B2 * | 1/2007 | White | .................. | G06F 11/106 714/754 |
| 9,270,297 B2 | 2/2016 | Sharon et al. | | |
| 9,384,144 B1 * | 7/2016 | Yeung | ................. | G06F 11/1016 |
| 9,471,421 B2 * | 10/2016 | Yeh | ..................... | G06F 11/1068 |
| 9,529,666 B2 * | 12/2016 | Lin | ...................... | G06F 11/1008 |
| 9,619,327 B2 * | 4/2017 | Ha | .......................... | G11C 29/52 |
| 9,632,866 B2 * | 4/2017 | Calderbank | ......... | G06F 11/1048 |
| 9,785,502 B2 * | 10/2017 | Zamir | ................. | G06F 11/1072 |
| 9,811,418 B2 * | 11/2017 | Sharon | ................ | G06F 11/1076 |
| 9,954,556 B2 * | 4/2018 | Kumar | .............. | H03M 13/2963 |

(Continued)

FOREIGN PATENT DOCUMENTS

| | | |
|---|---|---|
| CN | 104932951 | 9/2015 |
| TW | I543178 | 7/2016 |

*Primary Examiner* — Esaw T Abraham
(74) *Attorney, Agent, or Firm* — JCIPRNET

(57) ABSTRACT

An encoding method for a memory storage apparatus adopting a Lien ECC scheme is provided. The memory storage apparatus comprises an ECC encoder using a Lien Code. The encoding method includes: receiving a write command comprising a write address and a write data; reading an existing codeword comprising a first flip bit indicating bit-flipping of the existing codeword and flipping bits of the existing codeword based on the first flip bit; encoding the write data into a new codeword based on a Lien Code by an ECC encoder, and flipping bits of the new codeword based on a number of bits required to be changed from the existing codeword to the new codeword; and writing the new codeword comprising a first flip bit indicating bit-flipping of the new codeword to the write address In addition, a memory storage apparatus using the encoding method based on the Lien Code is provided.

15 Claims, 6 Drawing Sheets

(56) References Cited

U.S. PATENT DOCUMENTS

| | | | | |
|---|---|---|---|---|
| 9,979,417 B2* | 5/2018 | Zhang | ................... | G06F 11/10 |
| 2007/0255924 A1* | 11/2007 | Moyer | ................ | G06F 12/1027 |
| | | | | 711/202 |
| 2013/0238855 A1* | 9/2013 | Satran | ................. | G06F 12/0871 |
| | | | | 711/118 |
| 2013/0250686 A1* | 9/2013 | Marukame | ............. | G11C 16/08 |
| | | | | 365/185.12 |

* cited by examiner

ENCODING METHOD AND MEMORY STORAGE APPARATUS USING THE SAME

BACKGROUND OF THE INVENTION

1. Field of the Invention

The invention relates to a memory storage device, and more particularly, relates to an encoding method and a memory storage apparatus using the encoding method.

2. Description of Related Art

Generally, data to be written to a rewritable non-volatile memory (NVM) may be encoded into a codeword according to an error correcting codes (ECC). The codeword read from the rewritable non-volatile memory may also be processed by a corresponding decoding procedure to restore to the data. The codeword, is usually a combination of the data itself and a parity data generated according to the Bose-Chaudhuri-Hocquenghem (BCH) code, the hamming code, the hamming code with additional parity (SECDED), the Reed-Solomon code, or the Hsiao code, etc.

To improve NVM write power, write time and cycling reliability, an approach and an on-chip ECC algorithm are required to achieve low power design and page write time reduction and improve device reliability.

SUMMARY OF THE INVENTION

Accordingly, the invention is directed to an encoding method and a memory storage apparatus using the encoding method, in which a NVM flip bit write function is implemented with an ECC algorithm so as to reduce write time, write power and improve reliability.

An exemplary embodiment of the invention provides an encoding method for a memory storage apparatus adopting a Lien ECC scheme. The memory storage apparatus includes an ECC encoder using the Lien code. The encoding method includes: receiving a write command comprising a write address and a write data; reading an existing codeword comprising a first flip bit indicating bit-flipping of the existing codeword and flipping bits of the existing codeword based on the first flip bit; encoding the write data into a new codeword based on a Lien Code by an ECC encoder, and flipping bits of the new codeword based on a number of bits required to be changed from the existing codeword to the new codeword; and writing the new codeword comprising a first flip bit indicating bit-flipping of the new codeword to the write address.

Another exemplary embodiment of the present invention provides a memory storage apparatus adopting a Lien ECC scheme. The memory storage apparatus includes a connection interface, a memory array and a memory control circuit. The connection interface is configured to couple to a host system. The memory control circuit is coupled to the connection interface and the memory array, and configured to perform an encoding operation based on the Lien Code in response to receiving a write command comprising a write address and a write data. The memory control circuit comprises reading an existing codeword comprising a first flip bit indicating bit-flipping of the existing codeword and flipping bits of the existing codeword based on the first flip bit; encoding the write data into a new codeword based on a Lien Code by an ECC encoder, and flipping bits of the new codeword based on a number of bits required to be changed from the existing codeword to the new codeword; and writing the new codeword comprising a first flip bit indicating bit-flipping of the new codeword to the write address.

Based on the above, by adopting the encoding method and the memory storage apparatus provided in the invention, in response to receiving a write command, write data is encoded and compared with an existing codeword in the write address or with a pre-defined pattern so as to determine the number of bits required to be changed in writing. The bits of the encoded codeword are selectively flipped based on the determined number and at least one flip bit indicating bit-flipping are added to the codeword. As a result, the number of bit change in writing can be reduced and write time and power can be reduced.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
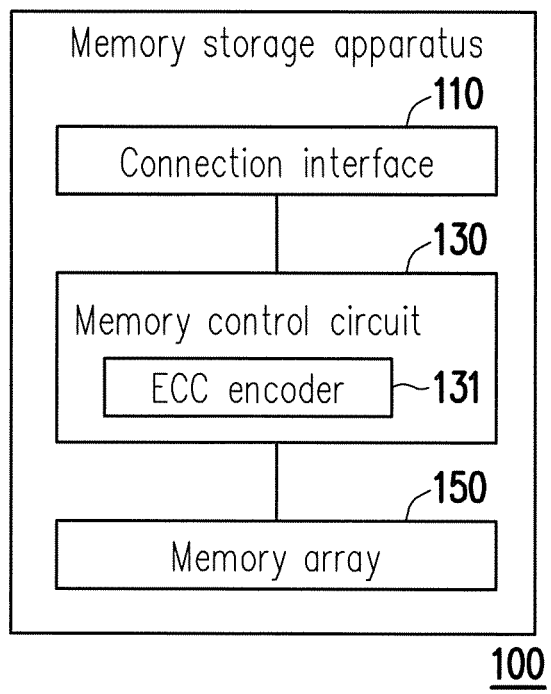
FIG. 1 is a schematic block diagram illustrating a memory storage apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, the memory storage apparatus 100 includes a connection interface 110, a memory control circuit 130, and a memory array 150. In one embodiment, the memory storage apparatus 100 is a rewritable non-volatile memory, and the memory array 150 includes a plurality of rewritable non-volatile memory cells.

In one embodiment, the connection interface 110 is configured to couple to a host system (not shown) through a Serial Advanced Technology Attachment (SATA) standard. In other embodiments, the connection interface 110 may comply with the Parallel Advanced Technology Attachment (PATA) standard, the Institute of Electrical and Electronic Engineers (IEEE) 1394 standard, or other suitable standards, which is not limited in the invention. In one embodiment, the connection interface 110 may be packaged with the memory control circuit unit 130 in one chip or laid outside a chip having the memory control circuit unit 130.

The memory control circuit 130 is coupled to the connection interface 110 and the memory array 150, and configured to execute a plurality of logic gates or control commands which are implemented in a hardware form or in a firmware form and perform operations such as data writing, reading or erasing in the memory array 150 according to the command of the host system.

In one embodiment, the memory storage apparatus 100 is a rewritable NVM adopting a Lien ECC scheme, where the memory control circuit 130 further includes an ECC encoder 131 using a Lien Code for encoding the data received through the connection interface 110, so as to generate a codeword and write the same into the memory array 150. A feature of the Lien Code is that one's complement of a codeword generated by using the Lien Code is still another codeword generated by using the Lien Code.

The memory array 150 is couple to the memory control circuit 130 including a plurality of memory cells (e.g., rewritable non-volatile memory cells). In one embodiment, the host system transmits a write command to the memory storage apparatus 100 for writing data thereto, and then the memory control circuit 130 encodes the write data into a codeword and stores the codeword in the memory array 150, in response to the write command.

Figure 2:
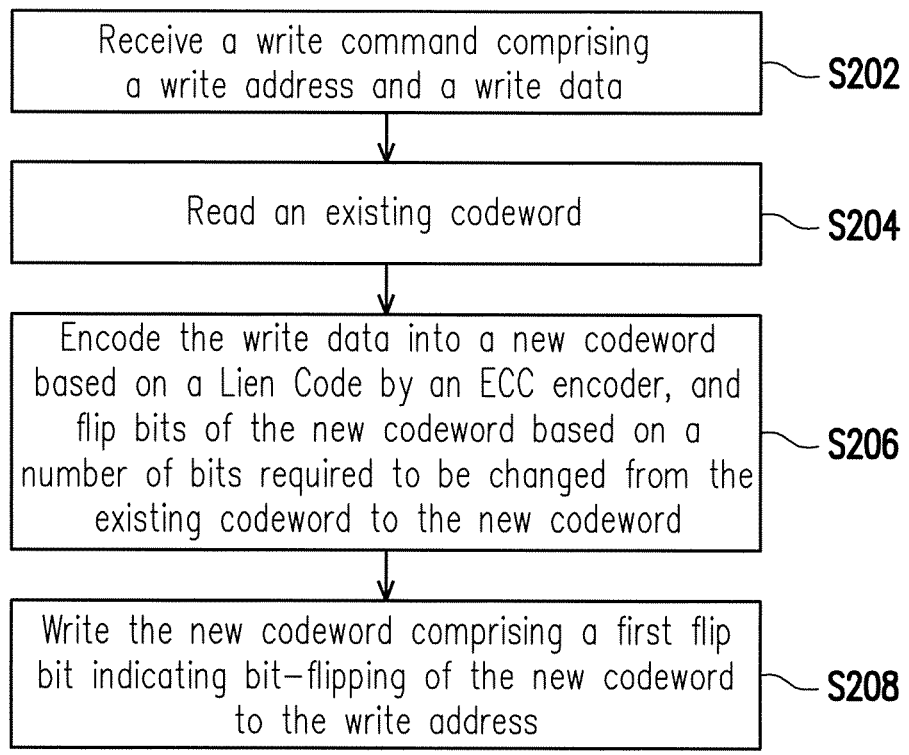
FIG. 2 is a flowchart illustrating an encoding method of the Lien Code according to an embodiment of the invention.

FIG. 2 is a flowchart illustrating an encoding method of the Lien Code according to an embodiment of the invention. The encoding method of the Lien Code may be performed by the memory storage apparatus 100 of the embodiment of FIG. 1. Therefore, the encoding method will be illustrated by referring to the aforementioned memory storage apparatus 100 in the present embodiment.

Referring to FIG. 2, the memory control circuit 130 receives a write command comprising a write address and a write data through the connection interface 110 (step S202). In response to the received write command, the ECC encoder 131 of the memory control circuit 130 previously reads an existing codeword (step S204). In one embodiment, the existing codeword is a codeword previously stored in the write address, and in another embodiment, the existing codeword is a codeword with a predefined data pattern (e.g., 000000 . . . , or FFFFFF . . . ), which is not limited herein.

Meanwhile, the ECC encoder 131 encodes the write data into a new codeword based on a Lien Code and flips a plurality of bits of the new codeword based on a number of bits required to be changed from the existing codeword to the new codeword (step S206). To be specific, the ECC encoder 131 may calculate a parity data of the write data based on the Lien Code, and combine the parity data and the write data to generate the new codeword in the step S206. Then, the ECC encoder 131 compares a plurality of bits of the encoded new codeword with a plurality of bits of the read existing codeword to determine the number of bits required to be changed from the existing codeword to the new codeword and determines whether the determined number of bits is over a predetermined threshold. It is noted that one's complement of the encoded new codeword is also a codeword.

In some embodiments, the predetermined threshold is half of the number of codeword bits, which is not limited herein. If the determined number of bits is determined as over the predetermined threshold, the ECC encoder 131 flips the plurality of bits in the encoded new codeword and generates a first flip bit indicating bit-flipping of the new codeword in the new codeword. In some embodiments, the ECC encoder 131 generates the first flip bit with a value 0 for indicating that the bits of the codeword to be written are all flipped. On the other hand, if the determined number of bits is determined as lower than the predetermined threshold, the ECC encoder 131 does not perform the bit-flipping on the bits of the encoded codeword. It is noted that if the predetermined threshold is equal to a half of the number of codeword bits and the determined number of bits is determined as equal to the predetermined threshold, that is, the number of bits to be changed is the same as a number of bits not to be changed, the ECC encoder 131 also does not perform the bit-flipping on the bits of the encoded new codeword.

Finally, the ECC encoder 131 writes the new codeword comprising the first flip bit to the write address (step S208).

Based on the above, since the number of bits changed from the existing codeword to the new codeword is reduced to be less than a half of the number of codeword bits by selectively flipping the bits of the codeword to be written, the write time and power can be reduced and the reliability can be improved.

Figure 3:
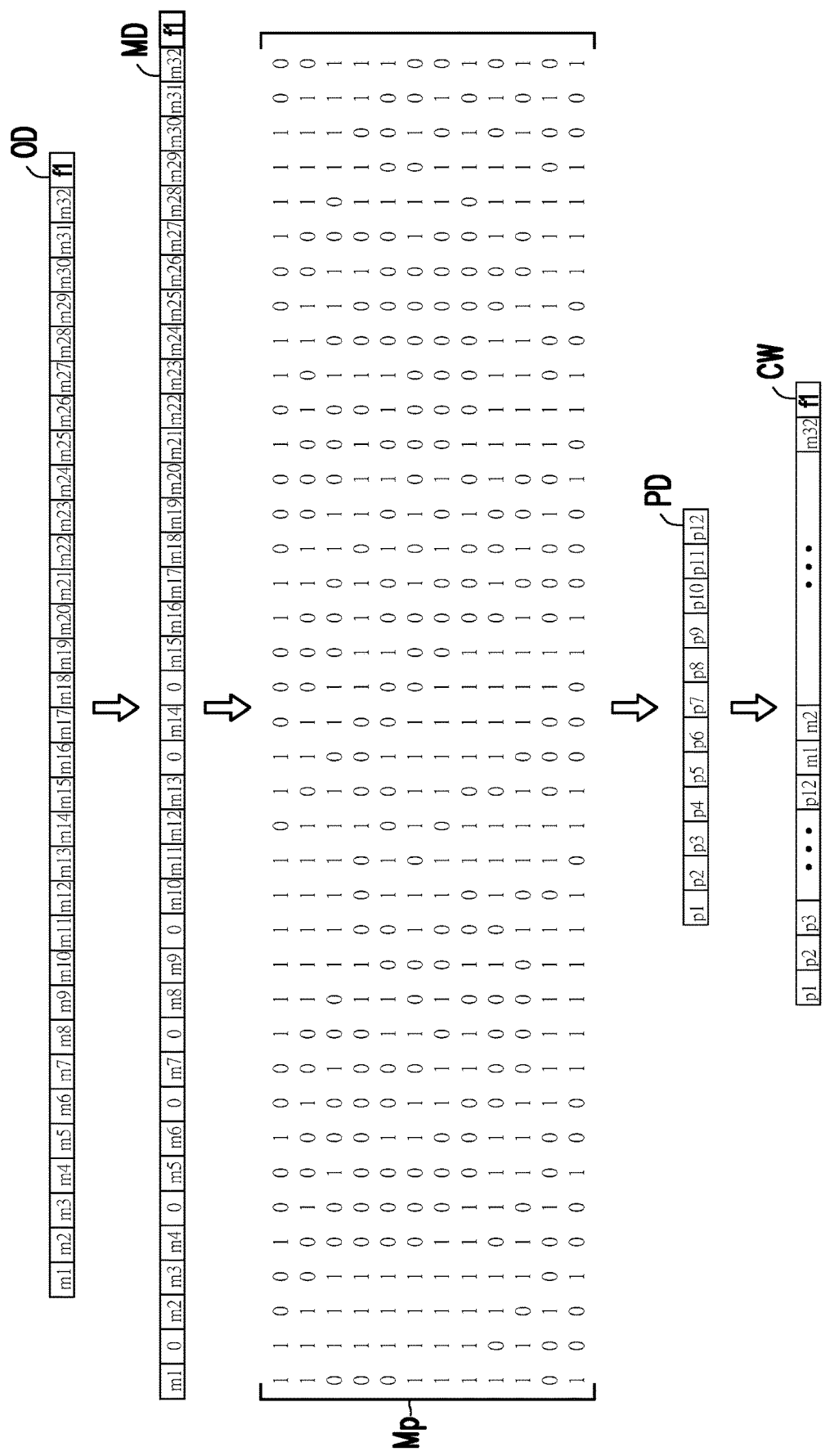
FIG. 3 is a schematic diagram illustrating a Lien code modified by BCH (51, 33, 7), encoding method according to another embodiment of the invention.

For example, FIG. 3 is a schematic diagram illustrating a Lien code modified by BCH (51, 33, 7), encoding method according to another embodiment of the invention.

Referring to FIG. 3, based on the Lien Code modified by BCH (51, 33, 7), the ECC encoder 131 encodes a 33-bit data OD including 32 data bits m1 to m32 and one flip bit f1 into a 51-bit codeword CW, and the matrix Mp is an 18*41 matrix used for calculating an 18-bit parity data PD of the 33-bit data OD. To be specific, the 33-bit data OD is expanded into a 41-bit data MD by inserting eight bits of "0" to the 33-bit data OD in advance, so as to generate the 41-bit data MD with the $8^{th}$, $10^{th}$, $14^{th}$, $15^{th}$, $16^{th}$, $23^{th}$, $28^{th}$ and $30^{th}$ bits are the inserted "0". The 41-bit data MD may be written in a one-column vector with 41 elements m1 to m32 and f1 and eight zeros as shown in FIG. 3, where the 33 elements m1 to m32 and f1 represent 33 bits of the data OD. The 41-bit data MD is then multiplied by the matrix Mp, so as to obtain a one-column vector with 18 elements p1 to p18 each represents one bit of the 18-bit parity data PD. Then, the ECC encoder 131 attaches the 33-bit data OD to the 18-bit parity bit data PD to generate the 51-bit codeword CW.

Based on the encoding method using Lien code described above, the new codeword comprising the flip bit is generated from the write data by the ECC encoder 131. It is noted, in one embodiment, the flip bit of the newly encoded codeword is determined to minimize the number of bits changed from the existing codeword read from the write address to the new codeword, and in another embodiment, the flip bit is determined to minimize a number of bits changed from the existing codeword with a predefined data pattern to the new codeword. Exemplary embodiments are given below for further illustration.

Figure 4:
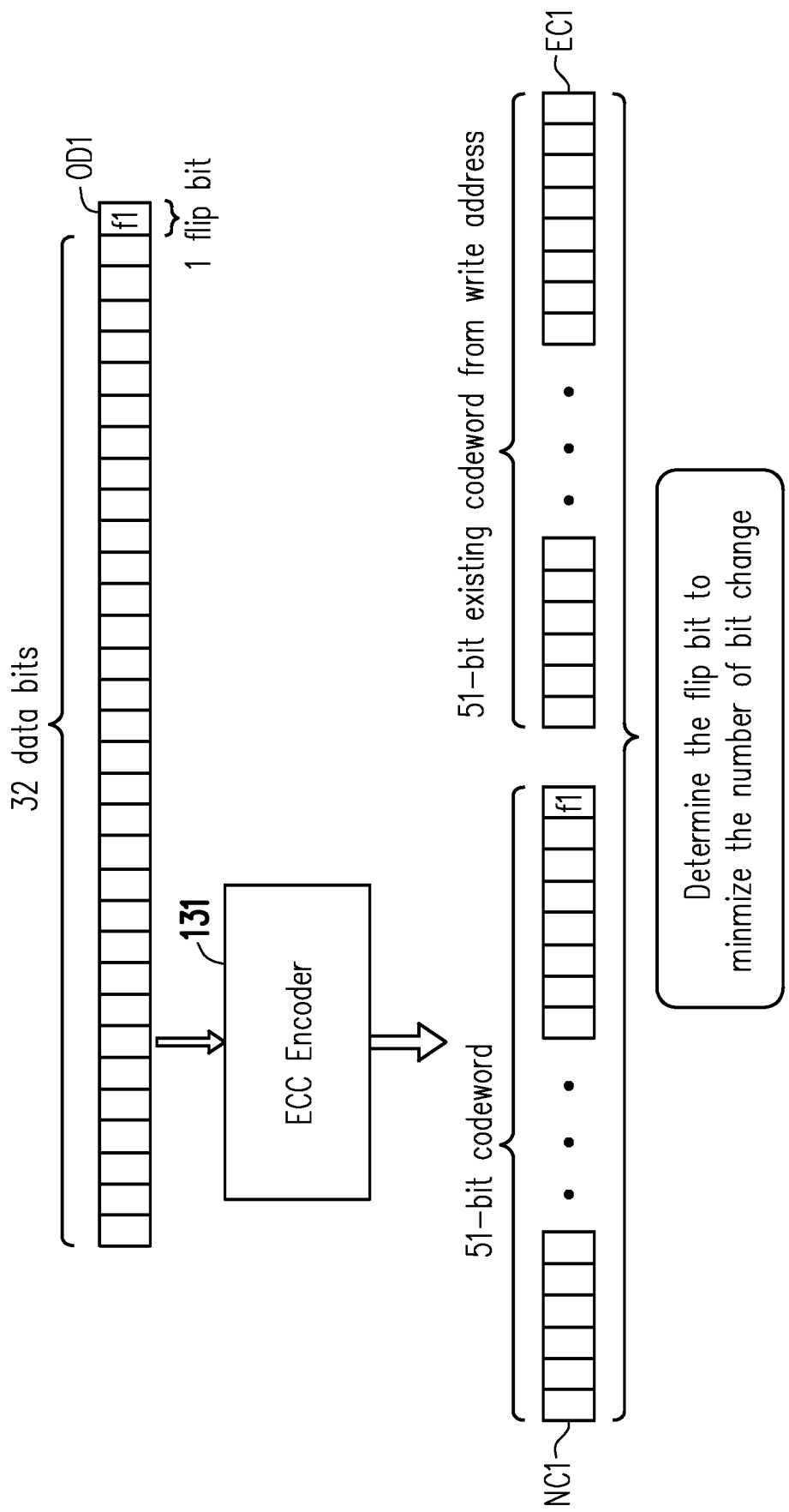
FIG. 4 is a schematic diagram illustrating an encoding method of the Lien Code modified by BCH (51, 33, 7) according to another embodiment of the invention.

FIG. 4 is a schematic diagram illustrating an encoding method of the Lien Code modified by BCH (51, 33, 7) according to another embodiment of the invention. Referring to FIG. 4, when receiving a write data OD1 comprising 32 data bits and one flip bit, the ECC encoder 131 encodes the write data OD1 into a 51-bit new codeword NC1 by using the ECC lien Code as described in the embodiment of FIG. 3. The ECC encoder 131 also reads out a 51-bit existing codeword EC1 from the write address and previously flips bits of the existing codeword EC1 based on the flip bit included in the existing codeword EC1. Then, the ECC encoder 131 compares a plurality of bits of the new codeword NC1 with a plurality of bits of the existing codeword EC1 to determine the flip bit of the codeword NC1 to minimize the number of bits changed from the existing codeword EC1 to the new codeword NC1. Finally, the ECC encoder 131 flips the bits of the new codeword NC1 based on the determined flip bit, updates the flip bit in the flipped new codeword NC1, and writes the new codeword NC1 comprising the flip bit to the write address.

Figure 5:
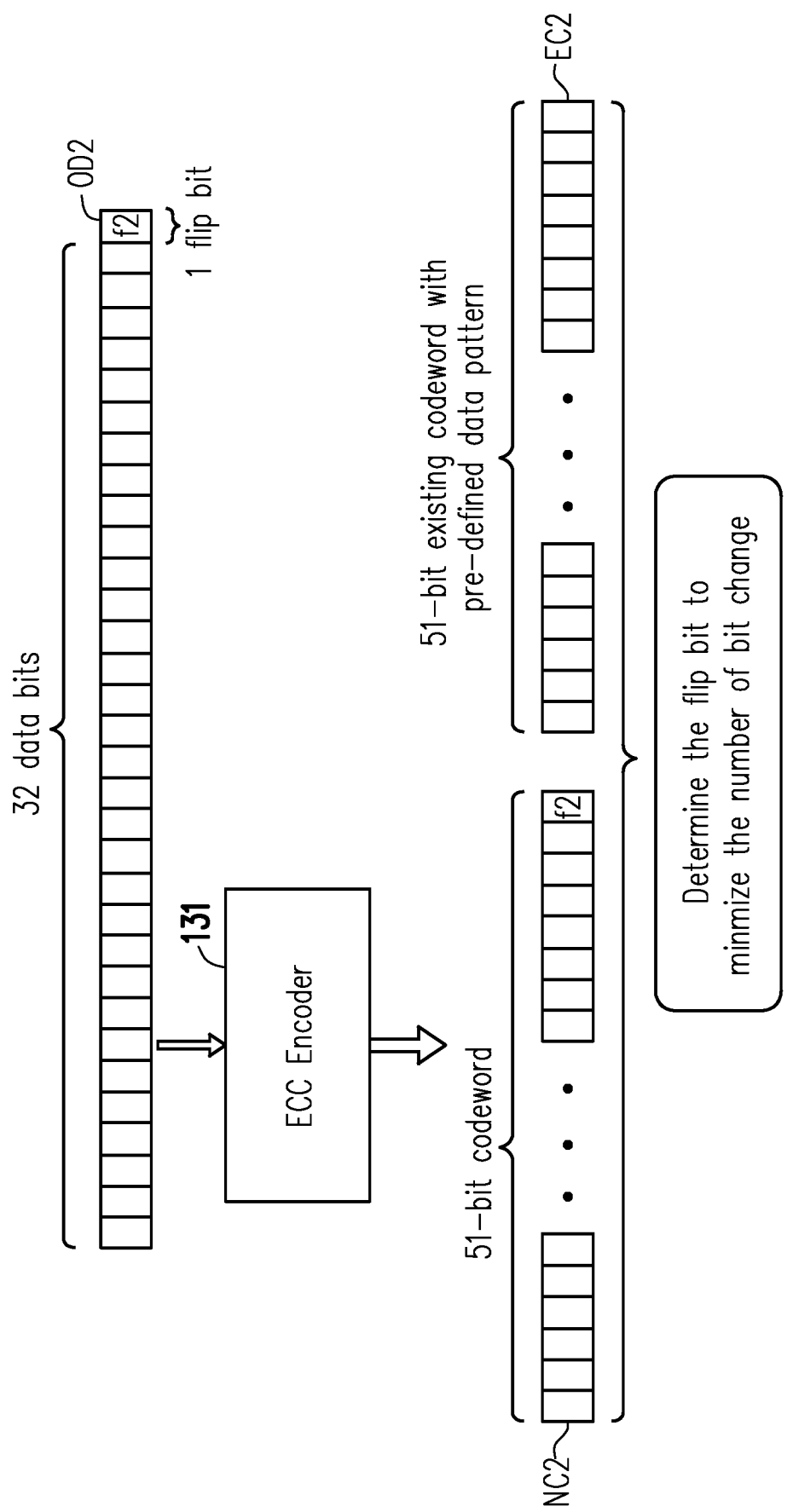
FIG. 5 is a schematic diagram illustrating an encoding method of the Lien Code modified by BCH (51, 33, 7) according to another embodiment of the invention.

On the other hand, FIG. 5 is a schematic diagram illustrating an encoding method of the Lien Code modified by BCH (51, 33, 7) according to another embodiment of the invention. Referring to FIG. 5, when receiving a write data OD2 comprising 32 data bits and one flip bit, the ECC encoder 131 encodes the write data OD2 into a 51-bit new codeword NC2 by using the ECC lien Code as described in the embodiment of FIG. 3. The ECC encoder 131 also reads out a 51-bit existing codeword EC2 with a predefined data pattern such as 000000 . . . . Then, the ECC encoder 131 compares a plurality of bits of the new codeword NC2 with a plurality of bits of the existing codeword EC2 to determine the flip bit of the codeword NC2 to minimize the number of bits changed from the existing codeword EC2 to the new codeword NC2. Finally, the ECC encoder 131 flips the bits of the new codeword NC2 based on the determined flip bit, updates the flip bit in the flipped new codeword NC2, and writes the new codeword NC2 comprising the flip bit to the write address.

It is noted, in some embodiments, in addition to minimizing the bit change in writing, the flip bit may be further used to minimize switching of selected bits such as parity bits so as to improve bit write endurance, but the disclosure is not limited thereto.

To further reduce write time and power, in some embodiments, multiple flip bits are adopted to respectively indicate the bit-flipping of different portions of the cordword, and in some embodiments, the flip bits are also contained in different portions of the cordword, which is not limited herein. In one embodiment, the flip bits include a first flip bit contained in one of a plurality of even bits of the codeword for indicating the bit-flipping of the even bits and a second flip bit contained in one of a plurality of odd bits of the codeword for indicating the bit-flipping of the odd bits.

Figure 6:
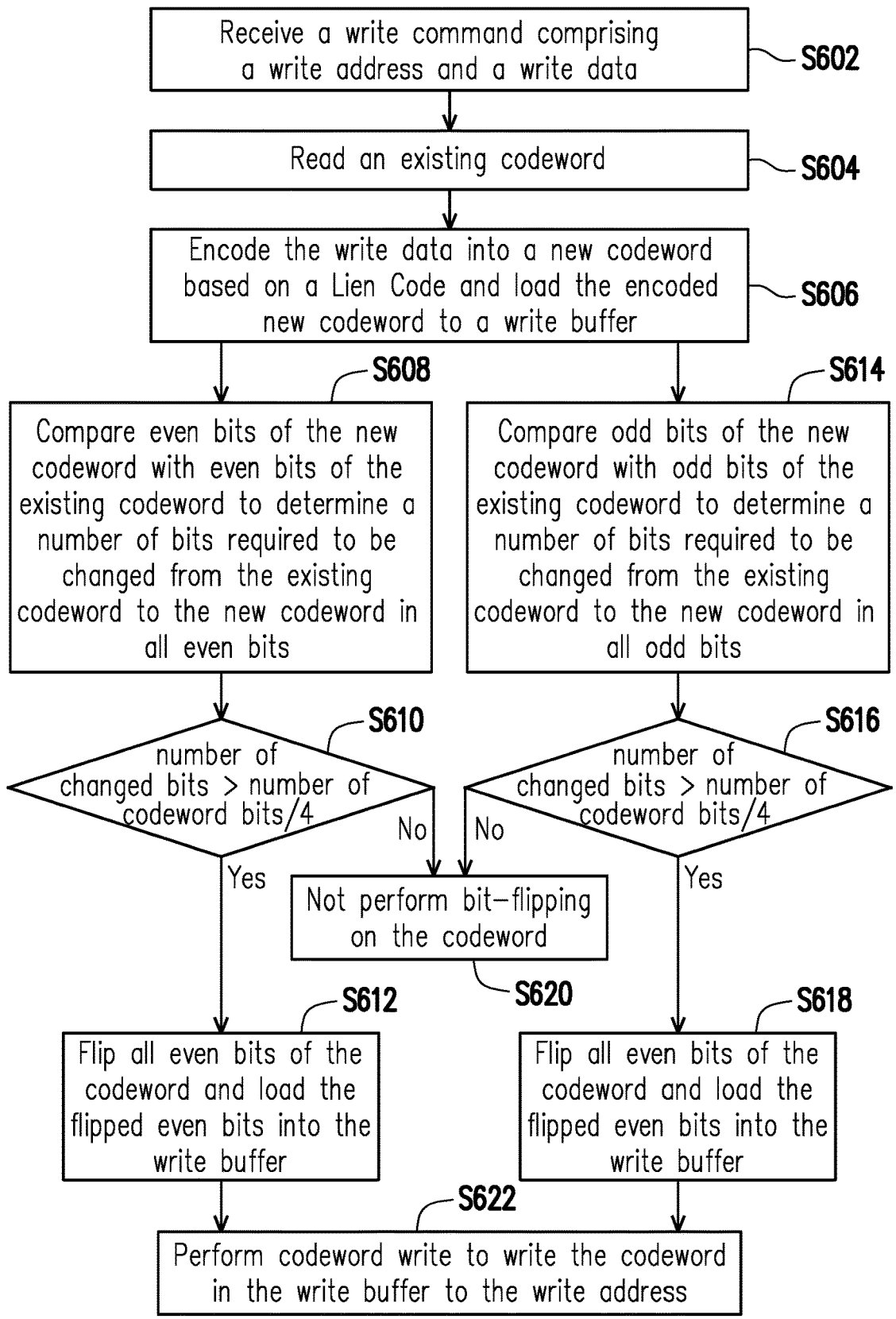
FIG. 6 is a flowchart illustrating an encoding method of the Lien Code according to an embodiment of the invention.

FIG. 6 is a flowchart illustrating an encoding method of the Lien Code according to an embodiment of the invention. The encoding method of the Lien Code may be performed by the memory storage apparatus 100 of the embodiment of FIG. 1. Therefore, the encoding method will be illustrated by referring to the aforementioned memory storage apparatus 100 in the present embodiment.

Referring to FIG. 6, the memory control circuit 130 receives a write command comprising a write address and a write data (step S602). In response to the received write command, the ECC encoder 131 of the memory control circuit 130 previously reads an existing codeword (step S604). In one embodiment, the existing codeword is a codeword previously stored in the write address, and in another embodiment, the existing codeword is a codeword with a predefined data pattern (e.g., 000000 . . . , or FFFFFF . . . ), which is not limited herein.

Meanwhile, the ECC encoder 131 encodes the write data into a new codeword based on a Lien Code without flipping the bits of the new codeword and loads the encoded new codeword to a write buffer (step S606), and then the ECC encoder 131 executes steps S608 and S614 in parallel or in a sequence. It is noted that one's complement of the encoded new codeword is also a codeword.

In step S608, the ECC encoder 131 compares even bits of the new codeword with even bits of the existing codeword to determine a number of bits required to be changed from the existing codeword to the new codeword in all even bits, and then determines whether the determined number of changed bits is over a quarter of a number of codeword bits (step S610). If yes, the ECC encoder 131 flips all even bits of the codeword and loads the flipped even bits into the write buffer (step S612).

Similarly, in step S614, the ECC encoder 131 compares odd bits of the new codeword with odd bits of the existing codeword to determine a number of bits required to be changed from the existing codeword to the new codeword in all odd bits, and then determines whether the determined number of changed bits is over a quarter of a number of codeword bits (step S616). If yes, the ECC encoder 131 flips all odd bits of the codeword and loads the flipped odd bits into the write buffer (step S618).

It is noted, in the steps S610 and S616, if the determination result is no, then the ECC encoder 131 does not perform bit-flipping on the codeword (step S620) and therefore there is no change in the write buffer. It is noted that, in each portion of the even bits and the odd bits, the ECC encoder 131 does not perform bit-flipping if the number of bits to be changed is the same as a number of bits not to be changed.

Finally, the ECC encoder 131 performs codeword write to write the codeword in the write buffer to the write address (step S622).

Based on the above, since the number of bits changed from the existing codeword to the new codeword is reduced by selectively and separately flipping the even bits and the odd bits of the codeword to be written, the write time and power can be further reduced and the reliability can be further improved.

Figure 7:
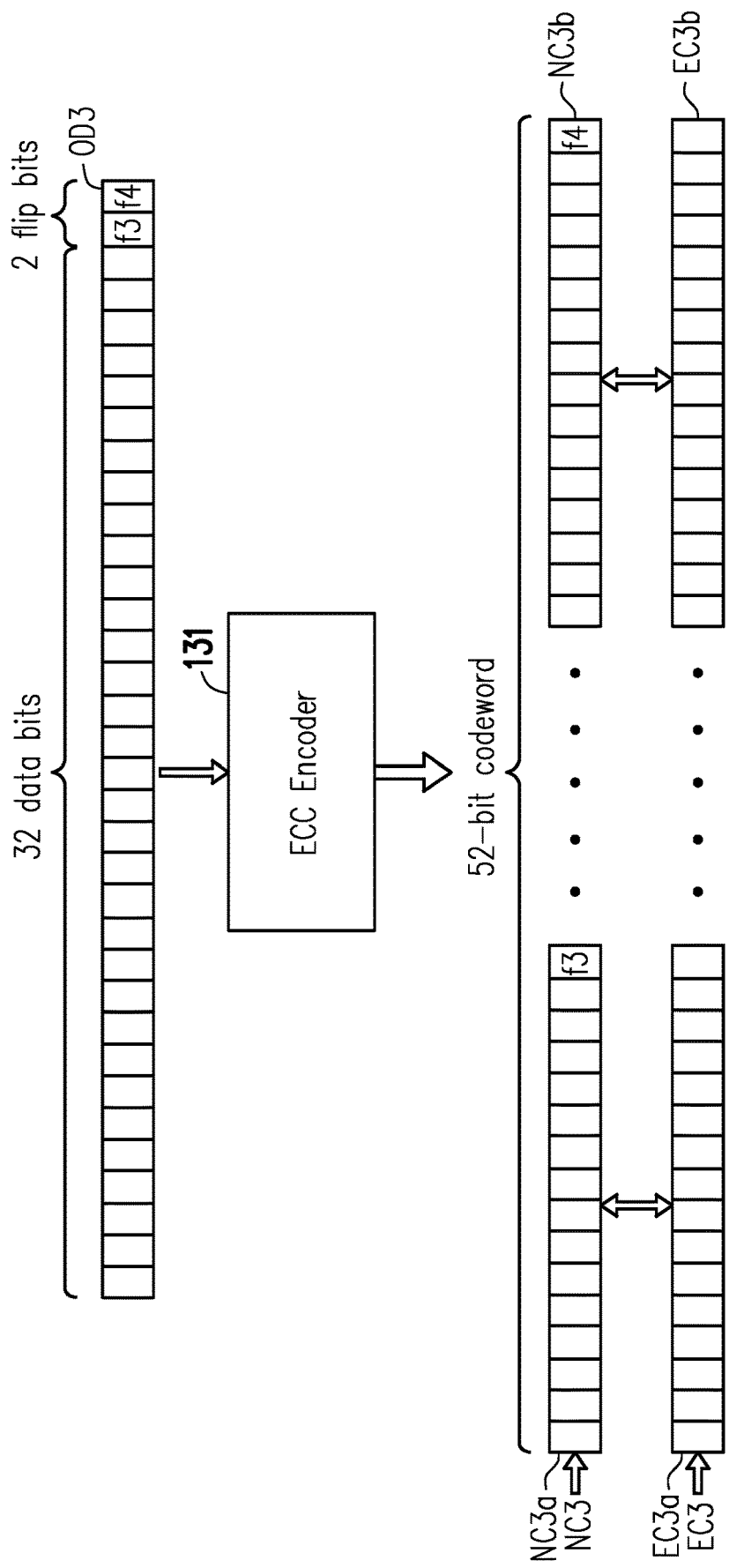
FIG. 7 is a schematic diagram illustrating an encoding method of the Lien Code modified by BCH (52, 34, 7) according to another embodiment of the invention.

For example, FIG. 7 is a schematic diagram illustrating an encoding method of the Lien Code modified by BCH (52, 34, 7) according to another embodiment of the invention. Referring to FIG. 7, when receiving a write data OD3 comprising 32 data bits and two flip bits f3 and f4, the ECC encoder 131 encodes the write data OD3 into a 52-bit new codeword NC3 by using the ECC lien Code. It is noted that, in some embodiments, the flip bits f3 and f4 individually control flipping of all even data bits and all odd data bits in the write data OD3 and accordingly, before encoding the write data OD3, the ECC encoder 131 may read the flip bits f3 and f4 and flipping even data bits and/or odd data bits in the write data OD3 based on the flip bits f3 and f4.

In some embodiments, in response to receiving the write command, the ECC encoder 131 also reads out a 52-bit existing codeword EC including two flip bits and previously flips even codeword bits and/or odd codeword bits in the existing codeword EC based on the flip bits.

Then, the ECC encoder 131 compares a plurality of even bits NC3a of the new codeword NC3 with a plurality of even bits EC3a of the existing codeword EC3 to determine the first flip bit f3 of the codeword NC3 to minimize the number of bits changed from the existing codeword EC3 to the new codeword NC3 in all even bits. Meanwhile, the ECC encoder 131 also compares a plurality of odd bits NC3b of the new codeword NC3 with a plurality of odd bits EC3a of the existing codeword EC to determine the second flip bit f4 of the codeword NC3 to minimize the number of bits changed from the existing codeword EC3 to the new codeword NC3 in all odd bits. The flip bits f3 and f4 determined above individually control flipping of all even codeword bits and all odd codeword bits in the codeword NC3. Further, it is noted that one's complement of any portion (i.e. even bits or odd bits) of the encoded new codeword is also a codeword.

Finally, the ECC encoder 131 flips the even bits NC3a of the new codeword NC3 based on the determined first flip bit f3, flips the odd bits NC3b of the new codeword NC3 based on the determined second flip bit f4, updates the first flip bit f3 and the second flip bit f4 in the flipped new codeword NC3, and writes the new codeword NC3 comprising the flip bits f3 and f4 to the write address.

In the aforesaid embodiments, the flip bits are determined to minimize the number of even bits and odd bits changed from the existing codeword to the encoded codeword. However, in some embodiments, the flip bits may be determined to minimize the number of bits changed in parity bits in the first portion or second portion containing the flip bit, but the disclosure is not limited thereto.

In summary, in the encoding method and the memory storage apparatus provided in the invention, a Lien ECC scheme based on a Lien Code is introduced to implement a NVM flip bit write function with BCH ECC algorithm, in which one or more flip bits are adopted to control data bits flipping or codeword bits flipping on different portions of the data bits or codeword bits. As a result, the number of bit change in writing can be reduced and write time and power can be reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An encoding method for a memory storage apparatus adopting an ECC scheme, comprising:
   receiving a write command comprising a write address and a write data;
   reading an existing codeword which is a codeword previously stored in the write address, or a codeword with a predefined data pattern;
   encoding the write data into a new codeword based on an ECC algorithm by an ECC encoder, wherein one's complement of any codeword of the existing codeword and the new codeword is also a codeword;
   flipping bits of the new codeword to minimize a number of bits required to be changed from the existing codeword to the new codeword; and
   writing the new codeword comprising a first flip bit indicating bit-flipping of the new codeword to the write address.

2. The encoding method as claimed in claim 1, wherein no bit-flipping is performed if the number of bits to be changed is the same as a number of bits not to be changed.

3. The encoding method as claimed in claim 1, wherein each codeword of the existing codeword and the new codeword comprises the first flip bit contained in a first portion of the codeword and further comprises a second flip bit contained in a second portion of the codeword.

4. The encoding method as claimed in claim 3, wherein each flip bit of the first flip bit and the second flip bit is determined to minimize the number of bits changed in the first portion or second portion containing the flip bit.

5. The encoding method as claimed in claim 3, wherein one's complement of the first portion or the second portion of any codeword of the new codeword and the existing codeword is also a codeword.

6. The encoding method as claimed in claim 3, wherein in each portion of the first portion and the second portion, no bit-flipping is performed if the number of bits to be changed is the same as a number of bits not to be changed.

7. The encoding method as claimed in claim 3, wherein each flip bit of the first flip bit and the second flip bit is determined to minimize the number of bits changed in parity bits in the first portion or second portion containing the flip bit.

8. The encoding method as claimed in claim 1, wherein the first flip bit is determined to minimize switching of selected bits in the new codeword and the existing codeword.

9. The encoding method as claimed in claim 8, wherein the selected bits are parity bits.

10. A memory storage apparatus adopting an ECC scheme, comprising:
    a connection interface configured to couple to a host system;
    a memory array; and
    a memory control circuit coupled to the connection interface and the memory array, and configured to perform an encoding operation in response to receiving a write command comprising a write address and a write data, wherein the encoding operation comprises:
    reading an existing codeword which is a codeword previously stored in the write address, or a codeword with a predefined data pattern;
    encoding the write data into a new codeword based on an ECC algorithm by an ECC encoder, wherein one's complement of any codeword of the existing codeword and the new codeword is also a codeword;
    flipping bits of the new codeword to minimize a number of bits required to be changed from the existing codeword to the new codeword; and
    writing the new codeword comprising a first flip bit indicating bit-flipping of the new codeword to the write address.

11. The memory storage apparatus as claimed in claim 10, wherein the memory control circuit is configured to not perform bit-flipping if the number of bits to be changed is the same as a number of bits not to be changed.

12. The memory storage apparatus as claimed in claim 10, wherein each codeword of the existing codeword and the new codeword comprises the first flip bit contained in a first portion of the codeword and further comprises a second flip bit contained in a second portion of the codeword.

13. The memory storage apparatus as claimed in claim 12, wherein the memory control circuit is configured to determine each flip bit of the first flip bit and the second flip bit to minimize the number of bits changed in the first portion or second portion containing the flip bit.

14. The memory storage apparatus as claimed in claim 12, wherein in each portion of the first portion and the second portion, the memory control circuit is configured to not perform bit-flipping if the number of bits to be changed is the same as a number of bits not to be changed.

15. The memory storage apparatus as claimed in claim 10, wherein the memory control circuit is configured to determine the first flip bit to minimize switching of selected bits in the new codeword and the existing codeword.

* * * * *